United States Patent [19]

French

[11] 4,357,632
[45] Nov. 2, 1982

[54] SEARCH TYPE TUNING SYSTEM WITH SYNCHRONIZATION SIGNAL PRESENCE TRANSITION DETECTOR

[75] Inventor: Michael P. French, Indianapolis, Ind.

[73] Assignee: RCA Corporation, New York, N.Y.

[21] Appl. No.: 261,448

[22] Filed: May 8, 1981

[51] Int. Cl.³ .............................................. H04N 5/50
[52] U.S. Cl. .................................................. 358/193.1
[58] Field of Search ............... 358/191.1, 192.1, 193.1, 358/195.1

[56] References Cited

U.S. PATENT DOCUMENTS 3,936,753 2/1976 Clark ..................................... 325/420
4,217,552 8/1980 Mogi et al. ........................... 455/164
4,236,182 11/1980 Minoura et al. ................... 358/193.1

*Primary Examiner*—John C. Martin
*Attorney, Agent, or Firm*—E. M. Whitacre; P. J. Rasmussen; P. M. Emanuel

[57] ABSTRACT

A signal seeking tuning system of a television receiver includes a composite synchronization detector which generates a logic "0" when various parameters of the composite synchronization signal is correct and a logic "1" when they are incorrect as the local oscillator frequency is being decreased. After a transition detector determines when a transition from a "0" to "1" occurs, indicating the location of a picture carrier, the frequency of the local oscillator is stopped from changing.

2 Claims, 10 Drawing Figures

SEARCH TYPE TUNING SYSTEM WITH SYNCHRONIZATION SIGNAL PRESENCE TRANSITION DETECTOR

The present invention pertains to the field of signal seeking tuning systems for television receivers in which the tuning control is changed during a search mode of operation until a proper carrier is located.

There are a vast variety of such signal seeking tuning systems. Most signal seeking tuning systems employ a detector which examines the condition of an automatic fine tuning (AFT) signal which is conventionally produced in a television receiver to indicate the degree of mistuning of the picture carrier of the IF signal. However, the AFT signal may respond to undesired signals in the same manner that it responds to a picture carrier. Accordingly, the AFT signal is not always a reliable indication of when a channel is properly tuned.

Accordingly, many signal seeking tuning systems employ detectors which determine that both an automatic fine tuning (AFT) signal and a picture synchronization component have predetermined conditions in order to determine when a picture carrier, rather than some undesired signal, has been tuned. In order for the research to be terminated, both the AFT signal and the picture component must have predetermined conditions associated with the proper tuning of the picture carrier. With the increase use of cable television master antenna installations, signal seeking tuning systems have become of more interest to manufacturers of television receivers because the RF carrier produced by such installations may be considerably translated in frequency in comparison to respective broadcast carriers which have standard frequencies. It has been found that with cable and master antenna installations as an RF source neither a detector which examines the AFT signal nor a detector which merely detects the presence of a correct synchronization component provides an accurate indication of the location of a picture carrier reliably enough for use in a search type tuning system.

In accordance with one aspect of the present invention, a signal seeking tuning system includes a transition detector for determining when a synchronization signal presence detector changes states to accurately determine the location of a picture carrier.

The present invention will be described with reference to the accompanying drawing in which:

FIGS. 1a and 1b, which are connected as indicated by the leads labeled "A", "B", "C" and "D", show partially in block diagram form and partially in logic diagram form an embodiment of the present invention as it may be employed in a phase locked loop (PLL) tuning system of a television receiver;

Figure 1A:
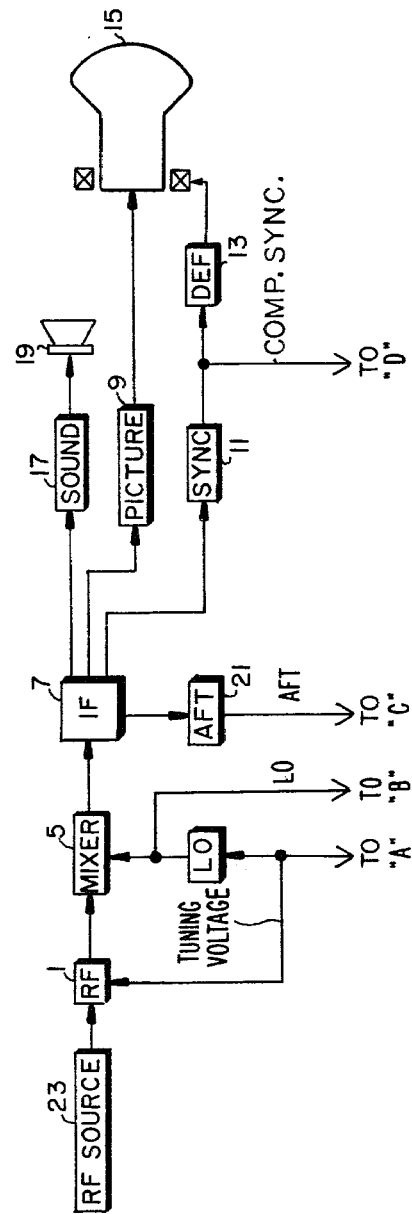
Figure 1B:
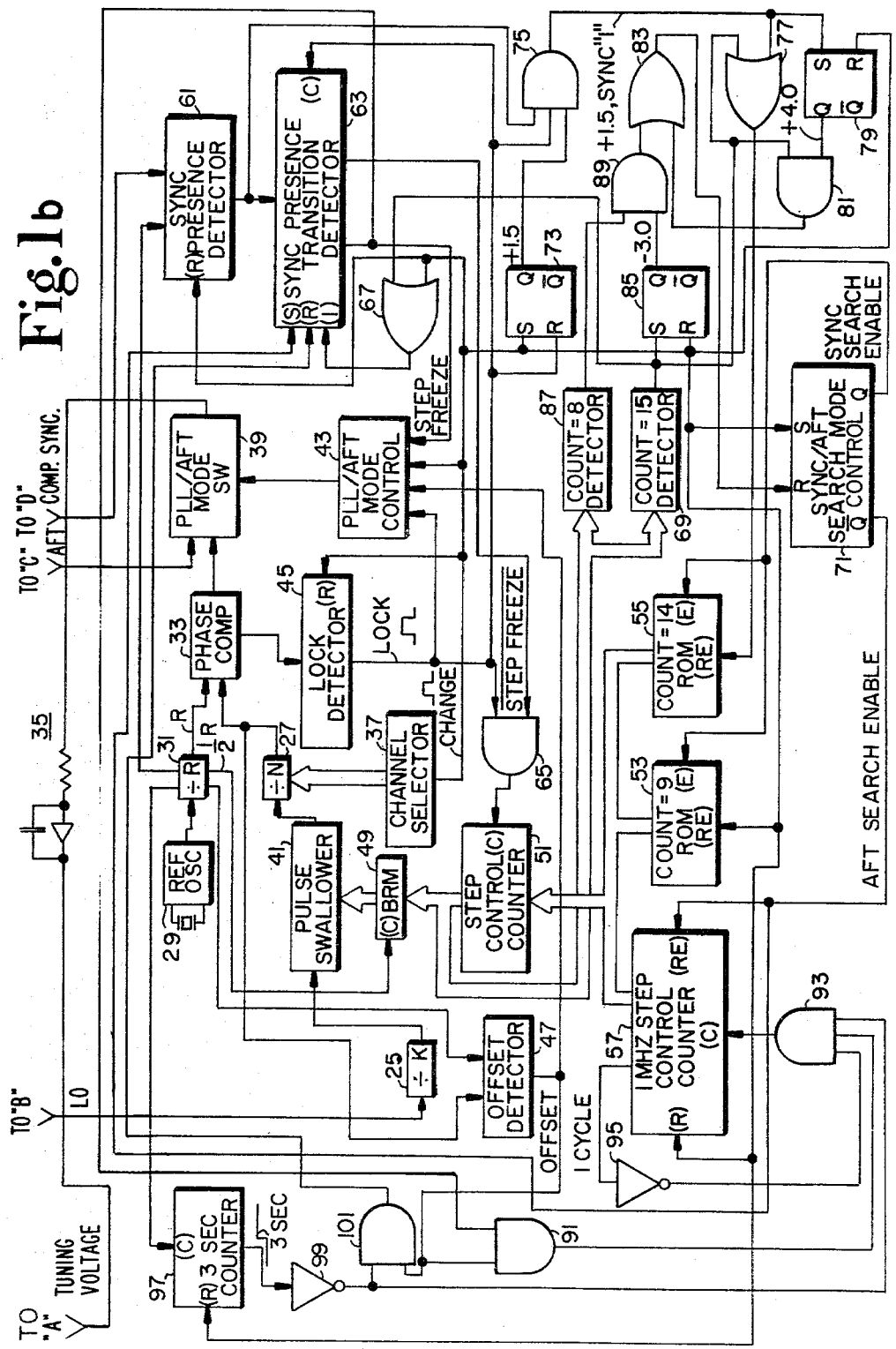
Figure 4:
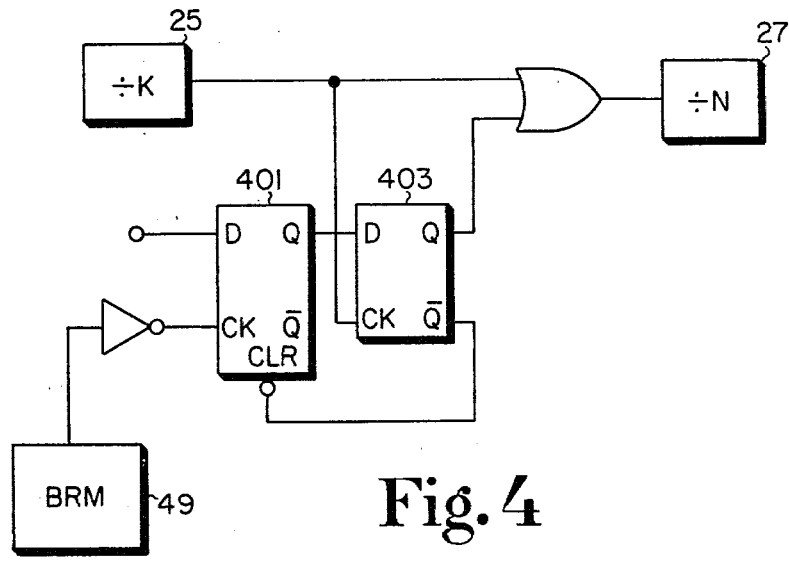
Figure 4A:
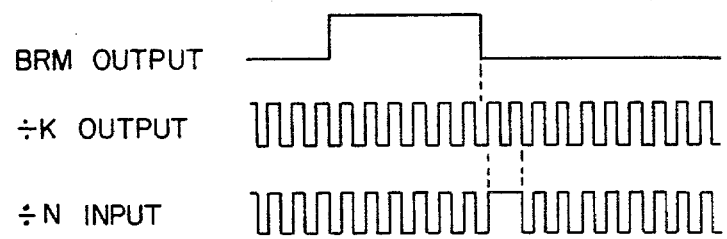
Figure 5A:
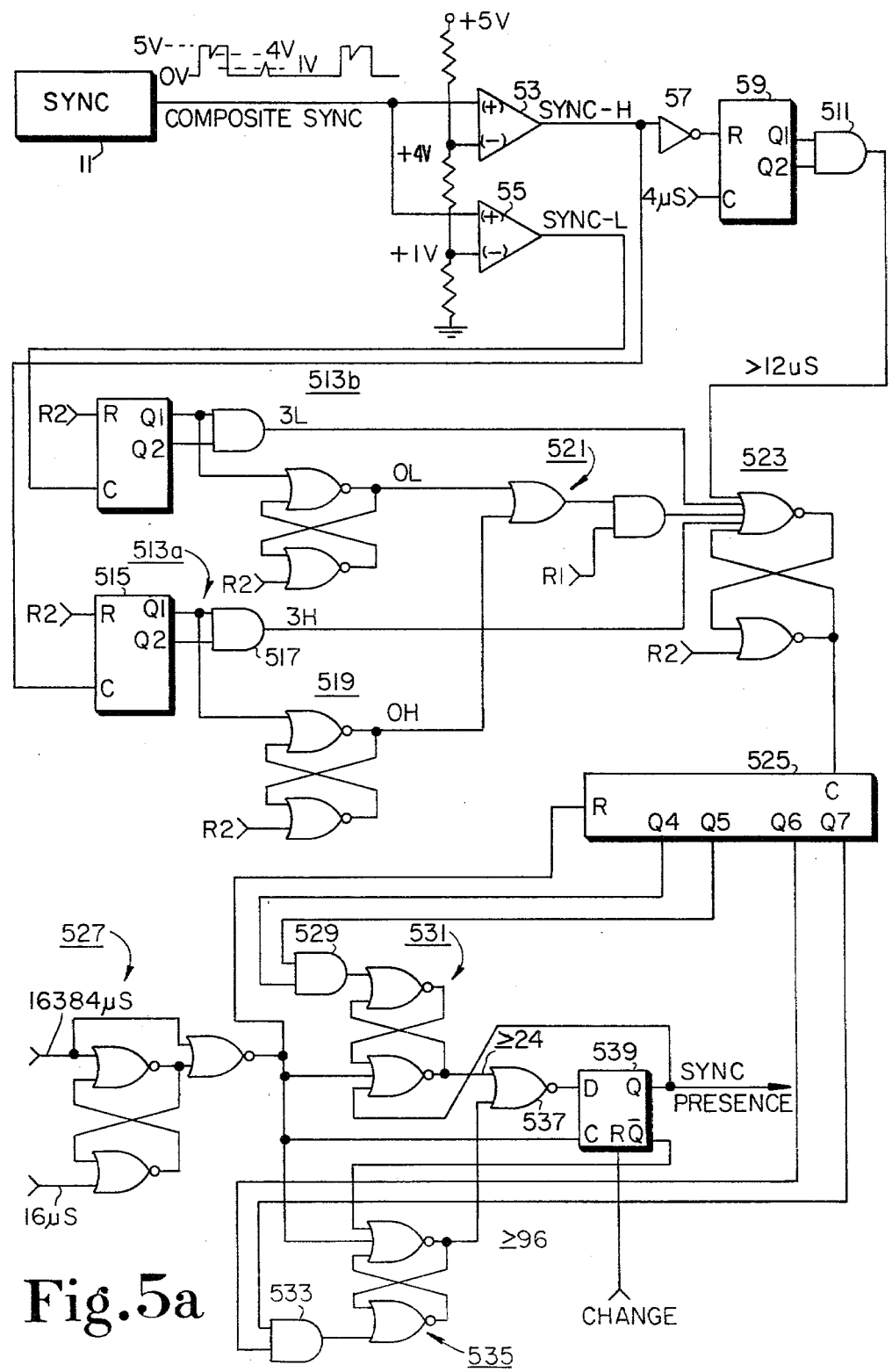
Figure 5B:
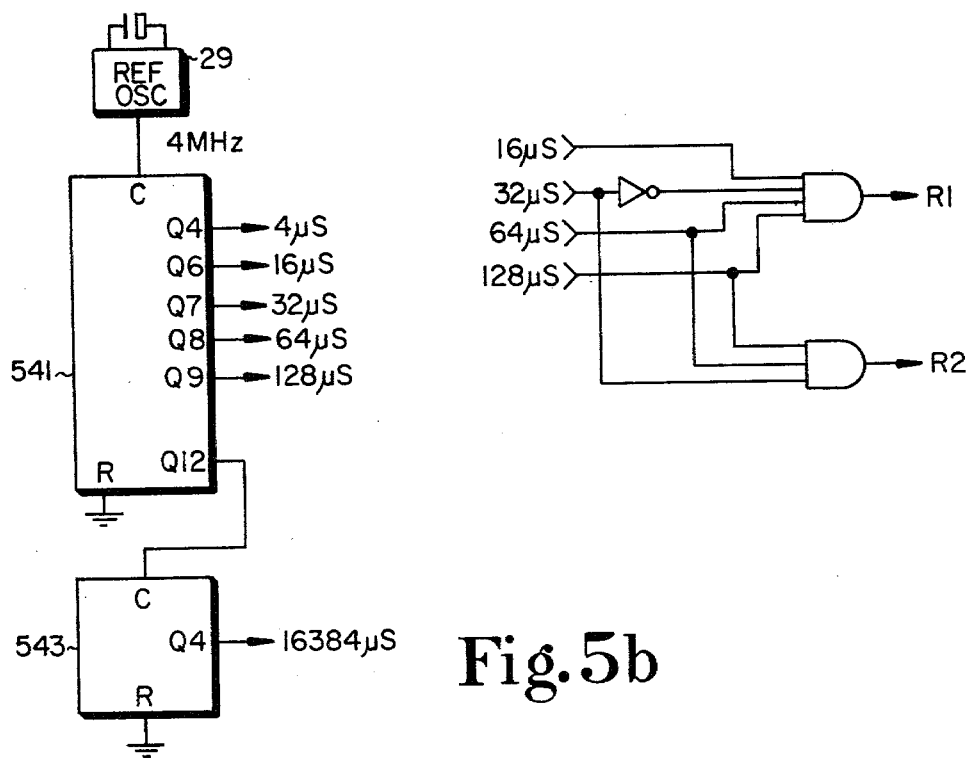
Figure 5C:
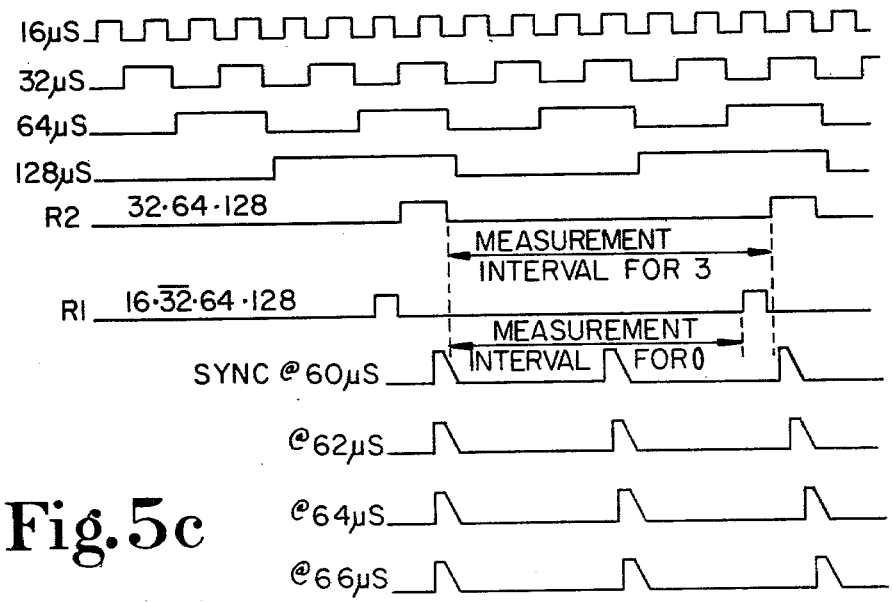

FIGS. 4, 5a, 5b and 6 shown logic implementations of portions of the tuning system shown in FIG. 1; and FIGS. 4a and 5c show waveforms useful in understanding the implementations of FIGS. 4, 5a and 5b, respectively.

In the television receiver shown in FIG. 1, a voltage controlled RF section 1, voltage controlled local oscillator (LO) 3, mixer 5, IF section 7, picture processing unit 9, picture synchronization unit 11, deflection unit 13, picture tube 15, sound processing unit 17 and speaker 19 are arranged in conventional manner. Synchronization unit 11 derives a so-called composite synchronization signal including both horizontal and vertical synchronization pulses from the IF signal. In response to these pulses, deflection unit 13 generates horizontal and vertical electron beam deflection signals for picture tube 15. A frequency discriminator 21 generates an AFT signal representing the degree and sense of deviation between the frequency of the picture carrier of the IF signal and its nominal value, e.g., in the United States, 45.75 MHz.

RF carriers are provided by an RF source 23, which may be an antenna, cable or master antenna installation, or video accessory like a video camera, video cassette player or video disc player.

The remaining portion of the receiver shown in FIG. 1 is a tuning control system for generating the tuning voltage for RF section 1 and LO 3. It includes a fixed divider or prescaler ($\div K$) 25, a programmable divider ($\div N$) 27, a crystal reference oscillator 29, a fixed divider ($\div R$) 31, a phase comparator 33 and a low pass filter (LPF) 235 coupled together with LO 3 in a phase locked loop configuration. The factor N by which programmable divider 27 divides is set in accordance with a digital word representing the channel number of the channel selected by means of channel selector 37.

When a switch 39, hereinafter referred to as the PLL/AFT mode switch for the reasons discussed below, is in a PLL state, the output of phase comparator 33 is coupled to the input of LPF. In this configuration, the LO frequency is set by phase locked loop operation in accordance with the value of N and the number of pulses removed from the input of programmable divider 27 by a pulse-swallower 41, the function of which will be described below. When PLL/AFT mode switch 39 is in an AFT state, the AFT signal generated by AFT discriminator 21 is coupled to the input of LPF 35. In this condition, the LO frequency is controlled in response to the AFT signal.

After a new channel is selected, channel selector 37 generates a "change" pulse to which a PLL/AFT mode control unit 43 responds to cause switch 39 to couple the output of phase comparator 33 to LPF 35 and thereby initiate PLL operation. As will be explained below, pulse swallower 41 is controlled to change the LO frequency in step-wise fashion. During each frequency step, a lock detector 45 coupled to phase comparator 33 generates a lock pulse when the phase deviation between the two input signals of phase comparator 33 has a predetermined low value. This signifies that the PLL operation for that step has been completed.

Under certain conditions to be detailed below, PLL/AFT mode control unit 43 causes switch 39 to couple the AFT signal to LPF 35. When LO 3 is under AFT control, an offset detector 47 counts the number of periods of the $\div N$ output signal during a reference interval to compare the frequency of the LO signal to the value established during the preceding PLL operation. If the LO frequency is offset, e.g., by 1.25 MHz, from the value established during the preceding PLL operation, PLL operation is again initiated and the LO frequency is stepped by controlling pulse swallower 41.

A phase locked loop tuning system of this general type is described in U.S. Pat. No. 4,031,549, entitled "Television Tuning System with Provisions for Receiving RF Carriers at Non-Standard Frequencies", issued in the names or Rast et al. on June 21, 1977. A tuning system of the type described in this U.S. patent is embodied in CTC-108 type television chassis manufactured by RCA Corporation of Indianapolis, Ind. and documented in "RCA Television Service Data—CTC 108", File 1980 C-5. That tuning system contains portions closely corresponding to respective portions of the present tuning system (with the exception of pulse swallower 41) so far described. Accordingly, the above-identified patent and RCA publication are incorporated by reference.

As earlier indicated, pulse swallower 41 selectively removes pulses from the input signal of programmable divider 27 and thereby step-wise changes the LO frequency. Specifically, in response to the digital word representing the channel number generated by channel selector 37, N is set to a value 3 less than the value of the nominal local oscillator frequency in MHz. Thus, for example, if channel 2 is selected, for which the frequency in the United States is 101 MHz, N is set to 98. Since programmable divider ($\div$N) 27 generates 1 pulse at its output for every N pulse at its input, by removing (i.e., "swallowing") input pulses to programmable divider 27, the LO frequency is increased. The number of pulses swallowed and the rate at which the pulses are swallowed determine the size of the step.

A binary rate multiplier (BRM) 49 controls the number of pulses swallowed and the rate at which they are swallowed. BRM 49 is a counter which generates a number of output pulses during the period of a clock signal applied to its clock (C) input which is directly proportional to the number represented by the digital word coupled to its control inputs from a step control counter 51. The frequency of the clock signal ($\frac{1}{2}$R) of BRM 49 is selected to be $\frac{1}{2}$ of the frequency of the reference frequency signal (R) coupled to phase comparator 33 from fixed divider 31 ($\div$R). Since the operation of the PLL causes the frequencies of the output signals of programmable divider 27 and fixed divider 31 to be equal, for each pulse swallowed by pulse swallower 41, the LO frequency is increased by $\frac{1}{2}$ MHz.

Step control counter 51 is a down counter, the contents of which are entered from a "count=9 ROM" 53, a "count=14 ROM" 55, or a "1 MHz step control counter" 57, and which are decreased in response to the application of a clock signal to its clock (C) input. Step control counter 51 is a 4-bit counter. Accordingly, the digital word generated at its output represents a number between 0 and 15. Since for each channel selected, N is set 3 lower than the respective nominal value for the selected channel, each of the numbers corresponds to a respective LO frequency step with respect to the nominal LO frequency for the selected channel as follows:

| CONTENTS OF COUNTER 51 | LO FREQUENCY STEP (IN MHZ) |
| --- | --- |
| 0 | $-3$ |
| 1 | $-2.5$ |
| 2 | $-2$ |
| 3 | $-1.5$ |
| 4 | $-1.0$ |
| 5 | $-0.5$ |
| 6 | 0 (nominal) |
| 7 | $+0.5$ |
| 8 | $+1.0$ |
| 9 | $+1.5$ |
| 10 | $+2.0$ |
| 11 | $+2.5$ |
| 12 | $+3.0$ |
| 13 | $+3.5$ |
| 14 | $+4.0$ |
| 15 | $+4.5$ (not used) |

As indicated, a count of 6 corresponds to the nominal LO frequency. A count of 15 corresponds to a step of $+4.5$ which, as will be explained below, is not used.

Desirably, each pulse generated by BRM 49 should remove only one pulse generated by prescaler ($\div$K) 25. The logic arrangement for this purpose and for swallowing or removing pulses generated by prescaler 25 from the input of programmable counter ($\div$N) 27 is shown in FIG. 4.

The CD4089 manufactured by RCA Corporation, Somerville, N.J., is an integrated circuit including a binary rate multiplier of the type suitable for use as BRM 49. In that integrated circuit, the counter corresponding to counter 51 for controlling the number of output pulses the binary rate multiplier produces is included with the binary rate multiplier structure itself. Accordingly, while counter 51 is shown separately for purposes of explanation, it will be appreciated that it may be part of BRM 49. In addition, the use of a pulse swallower for controlling the frequency of a local oscillator in a PLL is described in a magazine article entitled "Introduction to Microcomputer Controlled Radio Tuning System", by Schillhof, appearing in "Electronic Components and Applications", Vol. 1, No. 4, August 1979.

Figure 2:
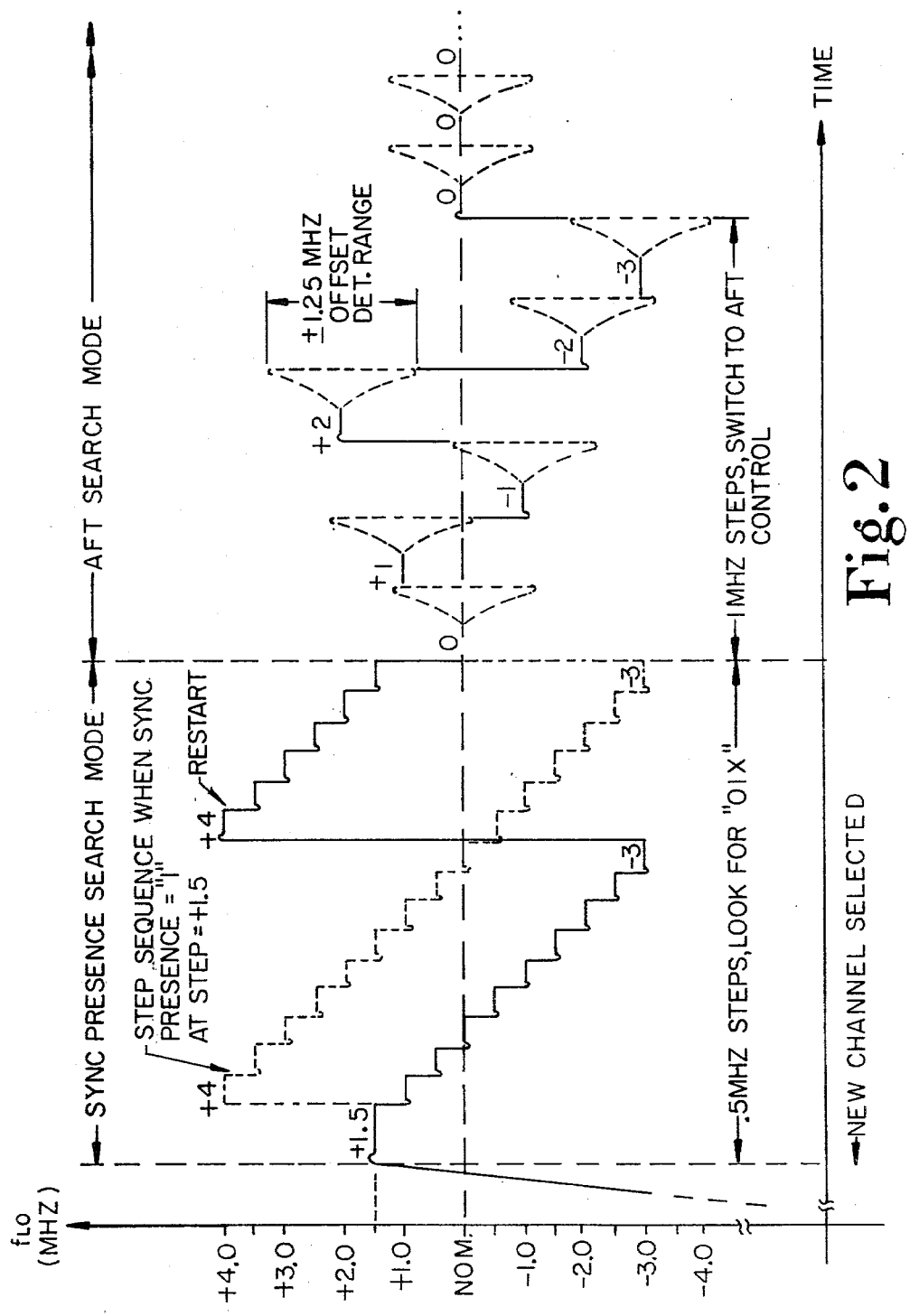
FIG. 2 shows a graph which illustrates the operation of the tuning system shown in FIG. 1; .

When a new channel is selected to properly locate and tune the picture carrier, the present tuning system first searches a first range of frequencies surrounding the nominal frequency for the selected channel by, in step-wise manner, using the composite synchronization signal and thereafter searches a second range of frequencies surrounding the nominal frequency by using the AFT signal. This is indicated in the graph shown in FIG. 2. As shown, the first and second ranges have a substantial overlapping or common portion, the first range extending from $+4$ MHz to $-3$ MHz of the nominal frequency and the second range extending from approximately $+3.25$ MHz to $-4.25$ MHz of the nominal frequency. In each search operation, the contents of step control counter 51 are changed in steps to effect corresponding changes of the LO frequency. Since, as will be explained below with reference to FIG. 3, the AFT has been found to provide an unreliably accurate indication of the presence and location of a picture carrier for a selected channel, a synchronization (hereinafter "sync") presence detector 61 examines several parameters of the composite sync signal. If all the parameters are within predetermined tolerance ranges, sync presence detector 51 generates a high logic level ("1") and otherwise generates a low logic level ("0"). An arrangement for this purpose is shown in FIGS. 5a and 5b.

However, the generation of a "1" by sync presence detector 61 alone does not reliably indicate the presence and location of the picture carrier for the selected channel. The reason for this, as well as for the unreliability of the AFT signal for the latter purpose, may be understood with reference to FIG. 3.

Figure 3:
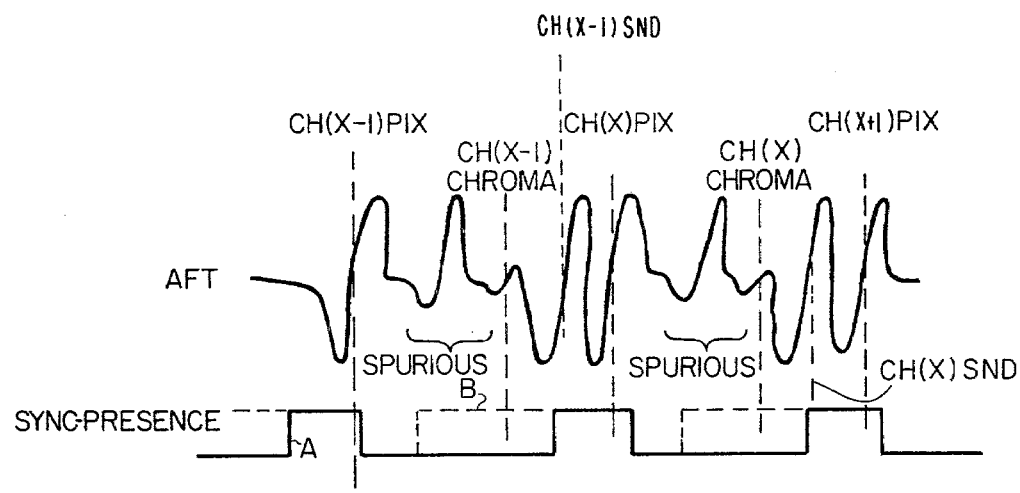
FIG. 3 shows a waveform useful in understanding the operation of the tuning system of FIG. 1.

FIG. 3 is a graphical representation of both the AFT signal and the output signal of sync presence detector 61 (hereinafter "sync presence" signal) as the LO frequency is increased, thereby causing the frequency of the IF carriers to correspondingly increase. In FIG. 3: "X" corresponds to the selected channel; "X−1" corresponds to the lower adjacent channel in the RF range (noting that $f_{IF}=F_{LO}-F_{rf}$); and "X+1" corresponds to the higher adjacent channel in the RF range. The term "PIX" corresponds to the picture carrier. The term "CHROMA" corresponds to the color carrier. The term "SND" correspond to the sound carrier. It will be noted that spurious signals (due to the undesired cross modulation products produced in mixer 5) and sound carriers produce a similar AFT response to that of the desired picture carrier of the selected channel. Accordingly, the AFT signal is an unreliable indication of the presence and location of the picture carrier. With reference to solid line waveform A, which represents the sync presence signal when IF section 7 employs a picture synchronous demodulator, it is noted that the level of the sync presence is a "1" for sound carriers as well as for the picture carrier. With reference to broken line waveform B, which represents the sync presence signal when IF section 7 employs an envelope detector, it is noted that the level of the sync presence signal is a "1" for spurious and sound carriers as well as for the picture carrier. Accordingly, the "1" level of the sync presence signal reliably indicates the presence but not the accurate location of the picture carrier.

To accurately determine the location of the picture carrier, in the present tuning system, a search is conducted by decreasing the frequency of the IF signal by decreasing the frequency of the LO signal and using a sync presence transition detector 63 to determine when the sync presence signal changes from a "0" to a "1". As is indicated in FIG. 3, when the searching occurs in the decreasing frequency direction, the "01" transition (hereinafter "01X") accurately determines when the picture carrier of the selected channel is in the AFT control range. It has been found that the "01X" occurs slightly higher than the nominal picture carrier frequency, which occurs at the center level of the AFT signal, by approximately 0.7 MHz. Accordingly, if a "01X" is detected during the sync transition search operation, the LO frequency is decreased by a 0.5 MHz step as will be explained below. (If the search were conducted in the increasing frequency direction, a "10X" would be sought. However, after the latter was found, the LO frequency would still decreased by 0.5 MHz.)

If a "01X" is obtained during a given LO frequency step, a "step freeze" signal is generated. In response, no further stepping occurs and PLL/AFT mode control unit 43 causes switch 39 to apply the AFT signal to LPF 35 so as to fine tune the LO frequency. If a "01X" is not obtained, the logical complement of the "step freeze" signal, i.e., "$\overline{\text{step freeze}}$", is generated and applied to the clock (C) input of step control counter 51 through an "and" gate 65, enabled by the "lock" pulse. In response, the LO frequency is decreased by 0.5 MHz to the next step.

Figure 6:
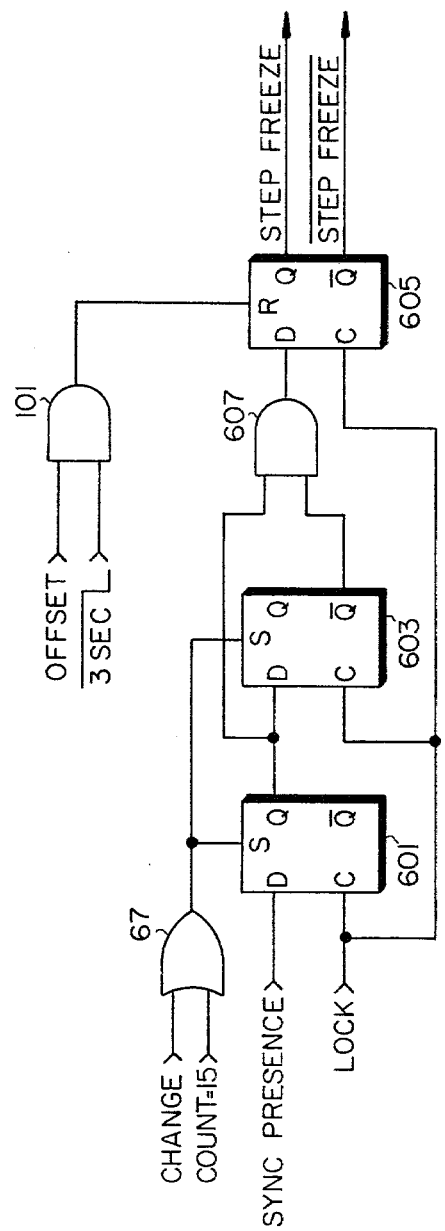

Sync presence detector 61 is reset in response to the application of the "change" pulse to its reset (R) input. Transition detector 63 is set to a predetermined initial state in response to the application of the "change" pulse or a signal generated by "count=15" detector 69, the function of which will be described below, to the reset (R) input through an "or" gate 67. As will be explained below, transition detector 63 is set and reset under certain conditions in response to the application of signals to its set (S) and reset (R) inputs, respectively, and utilizes the "lock" pulse, applied to its clock (C) input, as a clocking signal. A logic arrangement for sync presence transition detector 63 is shown in FIG. 6.

The remaining portion of the tuning system shown in the lower right-hand portion of FIG. 1 is the logic for selectively enabling the two search operations and for controlling the step sequence in the sync presence transition search operation. Those operations can best be understood by concurrent reference to FIGS. 1 and 2.

A "Sync/AFT search mode control unit" 71, simply comprising a set-reset flip-flop (SR FF), is responsive to the "change" signal coupled to its set (S) input to generate a "1" at its Q output, hereinafter referred to as the "sync search enable" signal. That signal is coupled to enabling (E) inputs of ROMs 53 and 55. When enabled, upon application of respective read signals to respective read (RE) inputs of the ROMs, they apply a respective 4-bit digit representing a count to step control counter 51. This in turn causes the LO frequency to assume a corresponding value as specified in the above table. For this purpose, ROMs 53 and 55 each may simply comprise four transmission gates (i.e., semiconductor switches) for selectively coupling respective logic levels, which in binary coded format represent the associated count, to step control counter 51.

Specifically, in response to the "change" signal (which is a pulse), ROM 53 binary signals representing a count of 9 are entered into step control counter 51. This causes the LO frequency to be set to a value +1.5 MHz above its nominal value. This initial step is selected because it is assumed that the RF carriers for many channels will be at or very near their standard values. In this case, with a +1.5 MHz step, the synchronization components of the IF signal will be removed by the conventional lower adjacent channel sound trap, e.g., in the United States at 47.25 MHz, thereby ensuring that the sync presence signal will be a "0". Assuming the RF carrier is at or very near its standard frequency and the "01X" occurs at about 0.7 MHz above the picture carrier, when the LO frequency is decreased by 0.5 MHz, as it will be since no "step freeze" would have been generated at the +1.5 MHz step, the sync presence signal remains a "0". However, on the next step, the sync presence signal becomes "1". In response to the resulting "01X", a "step freeze" signal is generated, preventing furthers steps and ensuring the AFT signal to be applied to LPF 35.

If the frequency of the RF carrier is translated from its standard value by a large positive offset (which corresponds to a large negative offset of the IF signal), e.g., 2 MHz, at the initial +1.5 MHz step, it is likely that the sync presence signal will be at its "1" level. Therefore, it would be logical to start the search at a large positive offset of the LO signal, e.g., at a +4 MHz step as indicated in the dotted line portion of FIG. 2. To accomplish this, the Q output of a SR FF 73 is set to a "1" (identified as the "+1.5" signal) in response to the "change" signal to indicate that the LO frequency is at the +1.5 step. At this point, if the sync presence signal is at its "1" level, when the "lock" signal (a positive-going pulse) is generated, an "and" gate 75 generates a "1" (identified as the "+1.5, sync '1'" signal) to indicate that at the +1.5 step the sync presence signal was at its "1" level. That "1" is coupled through an "or" gate 77 to the read enable (RE) input of ROM 55 and also to the set (S) input of an SR FF 79. In response, ROM 55 enters a count of 14 into step control counter 51 which causes the LO frequency step to be +4.0 MHz. In addition, the Q output of FF 79 is set to a "1" (identified as the "+4.0" signal) to indicate the step sequence starting from +4.0 MHz rather than from +1.5 MHz. This information is used later, as will be explained below.

Whether the sync transition search starts at the +1.5 or +4.0 step, when the "lock" signal is generated at the completion of each step, if the "01X" has not been generated, in response to the "step freeze" signal the contents of step control counter 51 are decreased by a count of 1. Accordingly, the LO frequency is decreased by 0.5 MHz. This process continues until the "01X" is detected and the "step freeze" signal is generated, in which case the search is stopped and the AFT signal is applied to LPF 35, or the end of the search range.

To detect the latter occurrence, a "count=15" detector 69 is coupled to the outputs of step control counter 51. The −3 MHz step corresponds to a count of 0. However, since if the "01X" is not detected during the −3 MHz step, which corresponds to a count of 0, the count is again decreased in response to the "step freeze" signal, the next count, which is 15 (i.e., the 4-bit digital word changes from 0000 to 1111), is detected rather than the 0 count. Detector 69 generates a "1" when a count of 15 is detected. For this purpose, detector 69 may simply comprise a four input "and" gate.

If the Q output signal of FF 79 is a "1", indicating that the search started at +4.0, an "and" gate 81 generates a "1" in response to the "1" generated by detector 69. This "1" signifies that the range for the sync presence transition search has been completely searched and is coupled through an "or" gate 83 to the reset (R) input of sync/AFT search mode control unit 71. This causes the $\overline{Q}$ of search mode control unit 71 (identified as the "AFT search enable" signal) to become a "1". As a result, the sync presence transition search mode is terminated and the AFT search mode, to be described below, is initiated.

The "1" generated by detector 69 is coupled to the S input of a SR FF 85 in response to which its Q output signal is set to a "1" (identified as the "−3.0" signal) to indicate that the end of the sync presence transition search range has been reached for future use as will be described below.

The "1" generated by detector 69 is also coupled through "or" gate 77 to the read (RE) input of "count=14" ROM 55. This sets the contents of step control counter 51 to 14. The purpose of this is to establish restart of the sync presence transition search mode at the +4.0 MHz step if it previously started only at the +1.5 MHz step as is indicated by a "0" at the Q output of FF 79. If the latter is true, "and " gate 81 would not have been enabled to generate a "1" in response to the "1" generated by "count=15" detector 69 as described above. Accordingly, if the Q output of FF 79 is a "0", the sync presence transition search will be enabled to restart the search at the +4.0 step.

The purpose of restarting the search at the +4.0 step is to cover the portion of the range between the +4.0 and 30 1.5 step which will not have been covered if the sync presence transition search initially started at the +1.5 step. However, since the search starting at the +1.5 step covered the portion of the range between the +1.5 and −3 steps, the search restarted at the +4.0 step need only go to the +1.5 step. To this end, a "count=8" detector 87 is employed to determine when the binary signals generated by step control counter 51 represent a count of 8. Although a count of 8 corresponds to a step of +1.0 rather than +1.5, it will be recalled that if the "step freeze" signal is not generated during the +1.5 step which corresponds to a count of 9, the count will be automatically decreased to a count of 8. Accordingly, a count of 8 properly indicates that the portion of the range between +4.0 and +1.5 has been searched.

When a count of 8 is detected, detector 81 generates a "1". Since the portion of the range between the +1.5 and −3.0 steps was previously searched, the Q output of FF 85 will be set at a "1". Accordingly, an "and" gate 89 is enabled to generate a "1" in response to the "1" generated by detector 87. The latter "1" is coupled through "or" gate 83 to the reset (R) input of search mode control 71 to end the sync presence transition search operation and initiate the AFT search operation by generating the "AFT search enable" signal.

During the sync presence transition mode, FF 73 is reset in response to the "lock" pulse. FFs 79 and 85 are reset in response to the "change" pulse.

By the end of the sync presence transition search mode, channels having picture carriers providing a correct composite sync signal will have been located and tuned. However, as earlier noted, some channels, such as music channels, do not have modulated picture carriers and therefore will not have a correct composite sync signal. Such channels are located and tuned during the AFT search mode as follows.

The "AFT search enable" signal is coupled to the set (S) input of sync presence transition detector 63 which causes the "step freeze" signal to e generated. The "AFT search enable" signal is also coupled to the read (RE) input of 1 MHz step control counter 57 which causes its contents to be entered into step control counter 51. Counter 51 is reset to a predetermined state corresponding to a count of 6 in response to the "change" pulse applied to its reset (R) input. Accordingly, in response to the "AFT search enable" signal, a count of 6 is entered into step control counter 51 which causes the nominal LO frequency to be established by PLL operation.

Thereafter, when the "lock" pulse is generated, PLL/AFT mode control unit 43, which has been enabled to respond to the "lock" pulse by the "1" level of the "step freeze" signal, causes the AFT signal to be applied to LPF 35. In response to the AFT signal, the LO frequency is continuously changed to reduce any frequency deviation of a picture carrier from its nominal value, e.g., in the United States 45.75 MHz.

If there is no picture carrier located for the nominal LO frequency step, the AFT signal will cause the LO frequency to drift beyond the predetermined offset, e.g., 1.25 MHz, detected by offset detector 47 and an "offset" signal will be generated. The "offset" signal is coupled to mode control unit 43 and, as a result, reestablishes PLL operation. In addition, an "and" gate 91 enabled by the "1" level of the "step freeze" signal couples the "offset" signal to the input to another "and" gate 93. The purpose of "and" gate 93 will be described below. For now, it is only necessary to understand that "and" gate 93 is enabled at this point and thereby couples the "offset" signal to the clock (C) input of 1 MHz step control counter 57. This causes counter 57 to change from the state corresponding to a count of 6 to a state corresponding to a count of 8 and the LO frequency is changed to a step +1.0 MHz from its nominal value. After the "lock" pulse is generated, the AFT signal is again coupled to LPF 35. If the "offset" signal is again generated, PLL operation is once again initiated and the state of 1 MHz step control counter 57 is changed to correspond to a count of 4. This causes the LO frequency to set to the −1.0 MHz step.

Thereafter, the tuning system switches between AFT and PLL control operations in the above-described manner for successive frequency steps of +2 MHz, −2 MHz and −3 MHz until a picture carrier is tuned during an AFT control operation as manifested by the absence of an "offset" signal. If no picture carrier for the selected channel is present, an "offset" signal will be generated during the −3 MHz step. In response, 1 MHz step control counter 57 is once again set to a state corresponding to a count of 6, i.e., the nominal LO frequency value and the AFT control operation is cyclically initiated when the "lock" pulse is generated. This continues until a picture carrier is provided for the selected channel or a new channel is selected. The nominal LO frequency step is selected while waiting for a picture carrier under the assumption that many, if not most, RF carriers are near their standard frequencies.

After the nominal LO frequency step is established, 1 MHz step control counter 57 is inhibited from being changed further, Specifically, when counter 57 completes one complete counting cycle, a "1 cycle" signal having a "1" level is generated. In response, an inverter 95 generates a "0" which disables "and" gate 93 and thereby prevents the "offset" signal from being coupled to the clock (C) input of counter 57.

Counter 57 may comprise a three stage Johnson counter which produces 6 states and a decoder for converting the binary output signals of each stage produced at each state into a respective count-representative digital word according to the following logic truth table.

| JOHNSON COUNTER STATE | COUNT | LO FREQUENCY STEP |
| --- | --- | --- |
| 111 | 6 | 0 |
| 011 | 8 | +1 |
| 001 | 4 | −1 |
| 000 | 10 | +2 |
| 100 | 2 | −2 |
| 110 | 0 | −3 |

In this case, to detect the completion of one cycle an "and" gate may be used to detect the 111 state and to set a first flip flop in response to the first generation of that state and a second flip flop in response to the second generation of that state.

If a picture carrier has been located and tuned in either the sync transition search or AFT search operations, after a predetermined time, e.g., 3 seconds, the step at which the tuning occurred is maintained even if the "offset" signal is thereafter generated because the RF signal is temporarily lost. To that end, a counter 97, receiving clock pulses from fixed divider (÷R) 31 at its clock (C) input and reset in response to the "change" pulse coupled to its reset (R) input, generates a positive-going pulse three seconds after a new channel is selected. An inverter 99 inverts the positive-going pulse signal to produce a negative-going pulse three seconds after a new channel is selected. That negative-going pulse is coupled to "and" gate 93 to disable it and thereby prevent "offset" signals from changing the contents of 1 MHz step counter 57. Prior to the pulse generated three seconds after a new channel is selected, the output signal is a "1" thereby enabling "and" gate 93 to respond to the "offset" signal. Accordingly, if a picture carrier has been tuned for less than three seconds but is lost, the contents of 1 MHz step counter 57 are changed in response to the "offset" signal as described above.

In the same vein, the negative-going pulse generated by inverter 99 three seconds after a new channel has been selected disables an "and" gate 101 from coupling the "offset" signal to the reset (R) input of sync presence transition detector 63. Prior to that time, "and" gate 101 is enabled to couple the "offset" signal to the R input of detector 63. In response, the "step freeze" is generated. This allows stepping to continue from the value previously set during the sync presence transition search mode as previously described.

It is noted that a step size of 1 MHz rather than 0.5 MHz is used during the AFT search mode since the continuous control provided by the AFT signal makes up for the difference in step size resolution.

The logic arrangement for pulse swallower 41 shown in FIG. 4 includes D (data) type flip-flops 401 and 403 arranged so that only one output pulse of the output signal of fixed divider (÷K) 25 is swallowed in response to the falling edge each BRM output pulse as indicated in the timing diagram shown in FIG. 4a.

The logic for sync presence detector 63 is shown in FIGS. 5a and 5b and its timing diagram is shown in FIG. 5c.

In FIG. 5c, if the composite synchronization (sync) signal generated by sync processing unit 11 is assumed to have nominal NTSC parameters, the synchronization pulses have a width of 4 microseconds and a period of 63.5 microseconds. Sync presence detector 63 examines the pulse width, period and noise content of the composite sync signal to determine if it is correct.

To that end, the composite signal, e.g., having excursions between +5 volts and ground potential, is coupled to the non-inverting (+) inputs of threshold comparators 53 and 55. A relatively high reference voltage, e.g., +4 volts, just below the maximum pulse amplitude, is applied to the inverting (−) input of comparator 53. A relatively low reference voltage, just above the minimum pulse amplitude, e.g., +1 volt, is applied to the inverting (+) input of comparator 55. Absent noise transients in the composite sync signal, each of the output signals of comparators 53 and 55 will include a number of pulses equal to the number of pulses in the composite synchronization signal. However, if undesired negative-going noise transients are present, these will result in extra pulses in the output signal of comparator 53. Similarly, if positive-going noise transients are present, there will be extra pulses in the output signal of comparator 55.

The output signal of comparator 53, hereinafter called SYNC-H, is coupled through an inverter 57 to the reset (R) input of a binary ripple counter 59 comprising, e.g., a CD4024 integrated circuit (IC) available from RCA Corporation, Somerville, N.J. A reference signal with a 4 microsecond period is applied to the clock (C) input of binary counter 59. The Q1 and Q2 output signals are applied to a "and" gate 511. In essence, this allows the number of 4 microsecond clock pulses to be roughly measured during the SYNC-H pulse width. (It is noted that since the 4 microsecond clock pulses are not synchronized with the SYNC-H pulses, this width measurement is only an aproximate one. However, it has been found to be effective to detect most, if not all, width errors.) If the pulses have a pulse width less than 8 microseconds, since the clock signal is only 4 microseconds long, the pulse width is taken as being correct and a count of 3 will not be reached. Accordingly, the output of "and" gate 511 will be at a low logic level ("0"). However, if the SYNC-H pulses have a width greater than 8 microseconds, a count of 3 will be reached and the output of "and" gate 511 will be a high logic level ("1").

The SYNC-H signal is also applied to a period counter 513a. Specifically, this SYNC-H signal is applied to the clock (C) input of a binary ripple counter 515, which may also comprise a CD4024 IC, along with a reference signal R2 as a reset signal to the reset (R) input. If the frequency of the SYNC-H signal is excessive, e.g., due to the presence of noise transients, counter 515 will reach a count of 3 and "and" gate 517 will produce a "1". A set-reset flip-flop 519 is set in response to R2. If the frequency of the SYNC-H signal is low, counter 515 will not reach a count of "1" and SR FF 519 will remain a "1". The output signal of flip-flop 519 is gated at the rate of a reference sampling signal R1 through a gating circuit 521 to a set (S) input of SR FF 523. The output of "and" gate 517 is also applied to an S input of SR FF 523. The output signal of "and" gate 511 is also applied to an S input of SR FF 523. Another frequency counter 513b, similar to 513a and having its output also coupled to an S input of SR FF 523, is responsive to the SYNC-L signal produced at the output of comparator 55 and therefore determines when its frequency is incorrect.

If any S inputs of SR FF 523 is a "1" before a reference signal R2, which is applied to the reset (R) inputs of SR FFs 519 and 523, occurs, a clock pulse is applied to a clock (C) input of an error counter, comprising a binary ripple counter 525, such as a CD4040 IC, when R2 is a "1".

The number accumulated by error counter 525 during a 16,384 microsecond measurememnt interval established by a timing circuit 527 determines whether the composite synchronization signal is correct or not. In response to the Q4 and Q5 output signals of binary counter 525, a first "and" gate 529 sets a first SR FF 531 when the number of errors is 24 or more. In response to the Q6 and Q7 output signals, a second "and" gate 533 sets a second SR FF 535 when the number of errors is 96 or more. The output signals of FFs 531 and 535 are applied through a "nor" gate 537 to the D input of a D FF 539. When a positive edge of the output signal of timing circuit 527 is generated, if either one of the input signals of "nor" gate 537 is a "1", the Q output signal of FF 539, i.e., the "sync presence" signal, is set to a "0", indicating an incorrect sync signal. Conversely, if neither one of the input signals of "nor" gate 537 is a "1", the Q output signal of FF 539 is set to a "1", indicating a correct composite synchronization signal.

The Q and $\overline{Q}$ output signals of FF 539 are fed back to the reset inputs of FFs 531 and 535 to prevent the output signals of FF 539 from changing state from one timing interval to the next when the error count is between 24 and 96. This provides hysteresis to prevent sporadic transitions in the output signals of FF 539.

FIG. 5b shows a logic arrangement for generating the various timing signals referred to above. It includes two cascade binary ripple counters 541 and 543 comprising, e.g., CD 4040 and CD4024 ICs, respectively, and desirably located in fixed divider ($\div$R) 31. Reference oscillator is selected to provide a 4 MHz clock (C) signal for counter 541. The remaining portion of the timing circuit includes an inverter and two "and" gates combining the output signals of counter 541 to generate timing signals R1 and R2. The timing diagrams of FIG. 5b also show the relationship between the composite sync pulses of various frequencies and the measurement intervals between R2 pulses and between R2 and R1.

The logic arrangement for sync presence transition detector 63 shown in FIG. 6 includes three D FFs 601, 603 and 605. The "lock" pulse is applied to the clock (C) input of these FFs. The "sync presence" signal is applied to the data (D) input of D FF 601 and Q output of D FF 601 is coupled to the D input of D FF 603. Accordingly, the sync presence level existing when a first "lock" pulse is generated is entered into D FF 601 and entered into D FF 603 in response to a second "lock" pulse generated. The sync presence level existing when the second "lock" pulse is generated is entered into D FF 601. If, at the time a third "lock" pulse is generated, the Q output of D FF is a "1" and the $\overline{Q}$ output is a "1" (which corresponds to a "01X" condition), an "and" gate 607 couples a "1" to the D input of D FF 605 and its Q output is set to a "1" as the "step freeze" signal. Because three "lock" pulses are needed before the "step freeze" signal is generated, the LO frequency is decreased by an additional 0.5 MHz step as described above. Sync presence transition detector 63 is set and reset in response to the operation of "or" gate 67 and "and" gate 101 as described above.

While the present tuning system has been described as being useful to accurately locate and tune those channels having modulated picture carriers as well as locating and tuning those, such as music channels, with unmodulated carriers, it is also useful when video accessories, such as camera, cassette and disc players are the RF source. This is so because when such accesories are in a standby mode, the picture carrier is unmodulated.

While the present invention has been described with reference to a preferred embodiment, modifications are intended to be within the scope of the invention defined by the following claims.

What is claimed is:

1. In a television receiver including RF means for selecting an RF signal from amoung a plurality of received RF signals, local oscillator means for generating a local oscillator signal, mixer means for generating an IF signal by heterodyning said selected RF signal and said local oscillator signal, and synchronization processing means for generating a picture synchronization signal, tuning control apparatus changing the frequency of said local oscillator in a given direction to locate an IF picture carrier, comprising:

synchronization presence detector means for generating a first level when said synchronization component is correct and for generating a second level when said synchronization component is incorrect;

synchronization presence transition detector means for determining the sequence in which said first and second levels are generated as the frequency of said local oscillator is changed in said given direction;

stop means coupled to said tuning control apparatus for inhibiting the frequency of said local oscillator from changing after said synchronization presence transition detector has determined that the first and second levels have been generated in a predetermined sequence depending on said given direction.

2. The apparatus recited in claim 1 wherein:
said stop means stops the frequency from changing after a transition from said second level to said first level is detected when the frequency has been decreasing.

* * * * *

UNITED STATES PATENT AND TRADEMARK OFFICE
CERTIFICATE OF CORRECTION

PATENT NO. : 4,357,632

DATED : November 2, 1982

INVENTOR(S) : Michael Peter French

It is certified that error appears in the above-identified patent and that said Letters Patent is hereby corrected as shown below:

Col. 1, line 26, change "research" to --search--.

Col. 2, line 22, change "235" to --35--.

Col. 5, line 4, change "$F_{LO}-F_{rf}$" to --$f_{LO}-f_{RF}$--.

Col. 7, line 59, change "30 1.5" to --+1.5--.

Col. 10, line 42, change "(+)" to --(-)--.

Col. 11, line 36, change "measurememnt" to --measurement--.

Signed and Sealed this

Eighth Day of February 1983

[SEAL]

Attest:

GERALD J. MOSSINGHOFF

*Attesting Officer*     *Commissioner of Patents and Trademarks*